(12) United States Patent
Hussell

(10) Patent No.: US 9,048,392 B2
(45) Date of Patent: Jun. 2, 2015

(54) LIGHT EMITTING DEVICE ARRAY ASSEMBLIES AND RELATED METHODS

(75) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 385 days.

(21) Appl. No.: 13/093,431

(22) Filed: Apr. 25, 2011

(65) Prior Publication Data

US 2011/0260182 A1 Oct. 27, 2011

Related U.S. Application Data

(60) Provisional application No. 61/343,130, filed on Apr. 23, 2010.

(51) Int. Cl.
| | |
|---|---|
| H01L 33/00 | (2010.01) |
| H01L 33/48 | (2010.01) |
| F21K 99/00 | (2010.01) |
| H01L 25/075 | (2006.01) |
| F21Y 101/02 | (2006.01) |
| F21Y 105/00 | (2006.01) |
| H01L 33/62 | (2010.01) |
| H05K 1/14 | (2006.01) |
| H05K 1/18 | (2006.01) |

(52) U.S. Cl.
CPC ............. *H01L 33/486* (2013.01); *F21K 9/30* (2013.01); *F21Y 2101/02* (2013.01); *F21Y 2105/001* (2013.01); *H01L 25/0753* (2013.01); *H01L 33/62* (2013.01); *H05K 1/141* (2013.01); *H05K 1/189* (2013.01); *H05K 2201/10106* (2013.01); *H01L 2224/48* (2013.01)

(58) Field of Classification Search
CPC ... H01L 33/62; H01L 33/486; H01L 2224/48; H01L 25/0753
USPC ...................... 257/88–103, E33.068
See application file for complete search history.

(56) References Cited

U.S. PATENT DOCUMENTS

| | | | |
|---|---|---|---|
| 4,936,808 A | 6/1990 | Lee | |
| 5,125,153 A | 6/1992 | Frey et al. | |
| 8,309,969 B2 * | 11/2012 | Suehiro et al. | ........... 257/99 |
| 2007/0247851 A1 | 10/2007 | Villard | |
| 2009/0050908 A1 | 2/2009 | Yuan et al. | |
| 2009/0134421 A1 * | 5/2009 | Negley | ........... 257/98 |
| 2009/0323334 A1 | 12/2009 | Roberts et al. | |

OTHER PUBLICATIONS

International Search Report for PCT Application No. PCT/US2011/033772 dated Jul. 22, 2011.

* cited by examiner

*Primary Examiner* — Cuong Q Nguyen
(74) *Attorney, Agent, or Firm* — Jenkins, Wilson & Taylor & Hunt, P.A.

(57) ABSTRACT

Light emitting device (LED) array assemblies and related methods are provided. An LED array assembly can include a primary substrate with an array of light emitting devices disposed on the primary substrate. The LED array assembly can also include a secondary substrate comprising at least one or more grooves. The primary substrate can be positioned on the secondary substrate with the grooves facing the primary substrate.

30 Claims, 10 Drawing Sheets

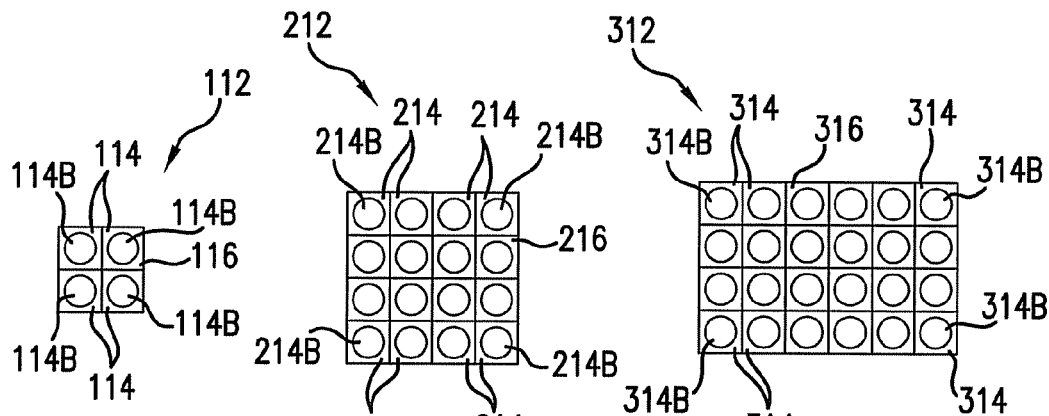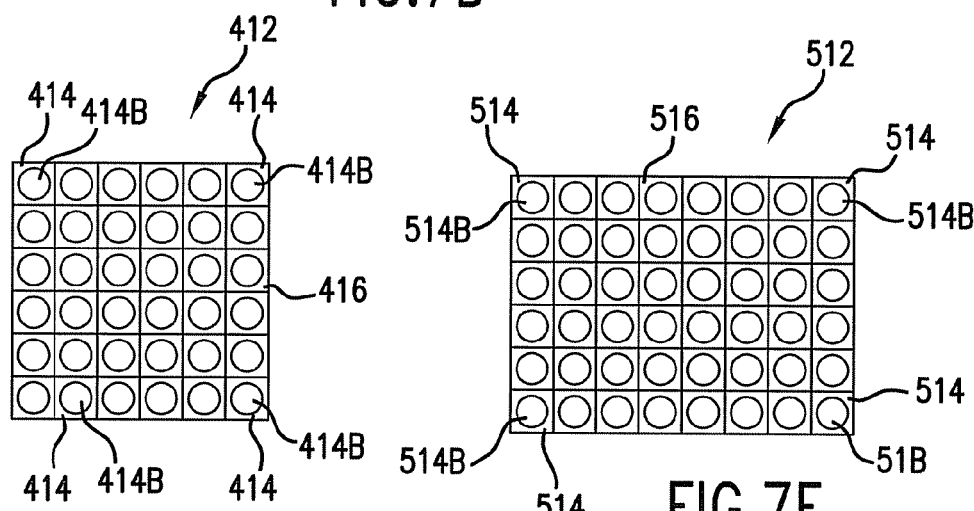

LIGHT EMITTING DEVICE ARRAY ASSEMBLIES AND RELATED METHODS

CROSS REFERENCE TO RELATED APPLICATION

The presently disclosed subject matter claims the benefit of and priority to U.S. Provisional Patent Application Ser. No. 61/343,130, filed Apr. 23, 2011, the disclosure of which is incorporated herein by reference in its entirety.

TECHNICAL FIELD

The subject matter disclosed herein generally relates to light-emitting device arrays. More particularly, the present subject matter relates to high-powered light-emitting device array assemblies and the mounting apparatuses of the assemblies on which high-powered light-emitting device arrays can be secured.

BACKGROUND

Light-emitting device ("LED") arrays are currently available that generally provide higher performance than traditional bulbs and other LED products used in lamps and luminaires and provide compact and cost-effective solid-state lighting solutions to serve the general lighting market. These products combine the higher efficiency, lifetime, and reliability benefits of LEDs with the light output levels of many conventional light sources.

LED arrays currently available are made by individually attaching separate and independent light-emitting diode chips on a substrate with a printed circuit board that is then attached to a separate heat sink. Each LED chip is individually separated, picked up, and then placed in its appropriate position. This is a time-consuming process that increases the likelihood of failure of the LED's and the LED arrays.

Further, even though the chips are individualized and placed separately on the arrays, the individual chips cannot be independently checked after removal from the wafer and placement within the array. Thus, after attachment, the likelihood of failure of a single LED can be high when as many as 16, 32 or 64 LEDs are placed in the array. In such embodiments, a single bad LED can cause the whole array to be scrapped or discarded. Thus, the reliability in the cutting, separating, and placing of the LEDs in the arrays has been a concern and has caused an increase in manufacturing costs.

SUMMARY

In accordance with this disclosure, high-powered LED array assemblies and related methods are provided. It is, therefore, one object of the present disclosure to provide high powered LED array assemblies and methods that have a unique construction that can increase the reliability and durability of the arrays.

An object of the presently disclosed subject matter having been stated hereinabove, and which is achieved in whole or in part by the presently disclosed subject matter, other objects will become evident as the description proceeds when taken in connection with the accompanying drawings as best described hereinbelow.

BRIEF DESCRIPTION OF THE DRAWINGS

A full and enabling disclosure of the subject matter disclosed herein including the best mode thereof to one of ordinary skill in the art is set forth more particularly below, including reference to the accompanying figures, in which:

FIGS. 7A-7F are schematic top views of example embodiments of LED arrays that can be used in different embodiments of an LED array assembly according to the subject matter disclosed herein;

DETAILED DESCRIPTION

Reference will now be made in detail to possible embodiments of the subject matter disclosed herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the figures, some sizes of structures or portions are exaggerated relative to other structures or portions for illustrative purposes and, thus, are provided to illustrate the general structures of the subject matter disclosed herein. Furthermore, various aspects of the subject matter disclosed herein may be described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion may be described herein as being formed "directly on" the structure or portion.

Furthermore, relative terms such as "on" or "above" are used herein to describe one structure's or portion's relationship to another structure or portion as illustrated in the figures. It will be understood that relative terms such as "on" or "above" are intended to encompass different orientations of the device in addition to the orientation depicted in the figures. For example, if the device in the figures is turned over, structure or portion described as "above" other structures or portions would now be oriented "below" the other structures or portions. Likewise, if the device in the figures is rotated along an axis, structure or portion described as "above", other structures or portions would now be oriented "next to" or "left of" the other structures or portions. Like numbers refer to like elements throughout.

As illustrated in the figures, high-powered light-emitting device ("LED") array assemblies and methods are provided that can comprise high-powered LED arrays and mounting apparatuses on which the high-powered LED arrays can be secured. While being relatively small, these LED arrays can provided a large amount of light depending on the amount of power that is supplied to them. These LED arrays can be used in a wide variety of lighting areas from indoor lamps to large area outdoor lighting. For example, these LED arrays can be used in downlights, streetlights, spotlights, etc.

Figure 1:
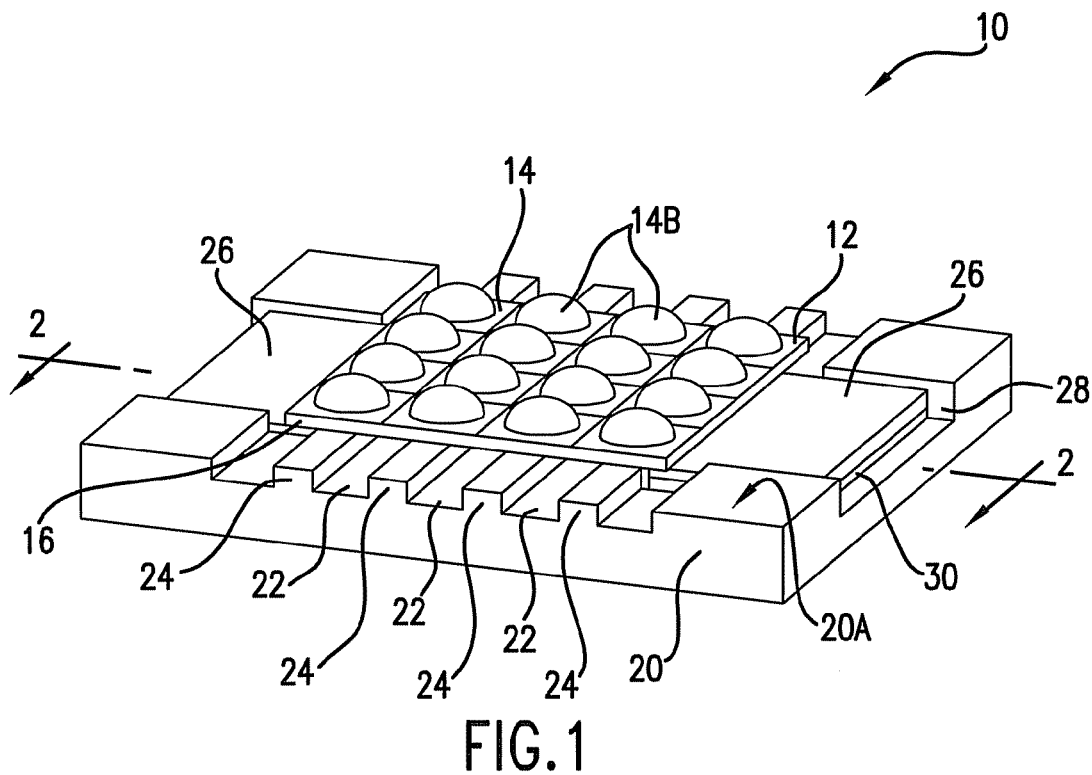
FIG. 1 is a perspective view of an embodiment of an LED array assembly according to the subject matter disclosed herein.
Figure 2:
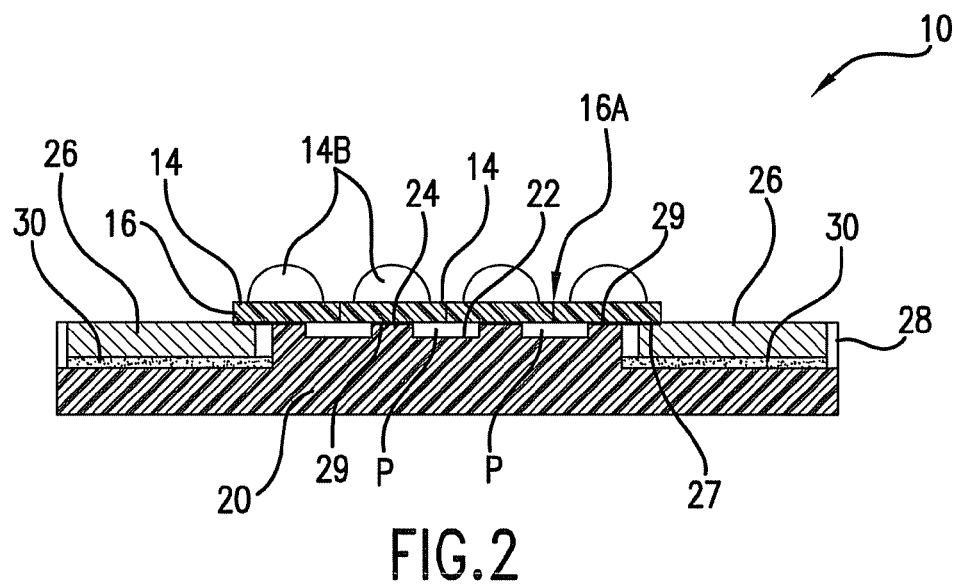
FIG. 2 is a cross-sectional view of the embodiment of the LED array assembly according to FIG. 1.
Figure 3:
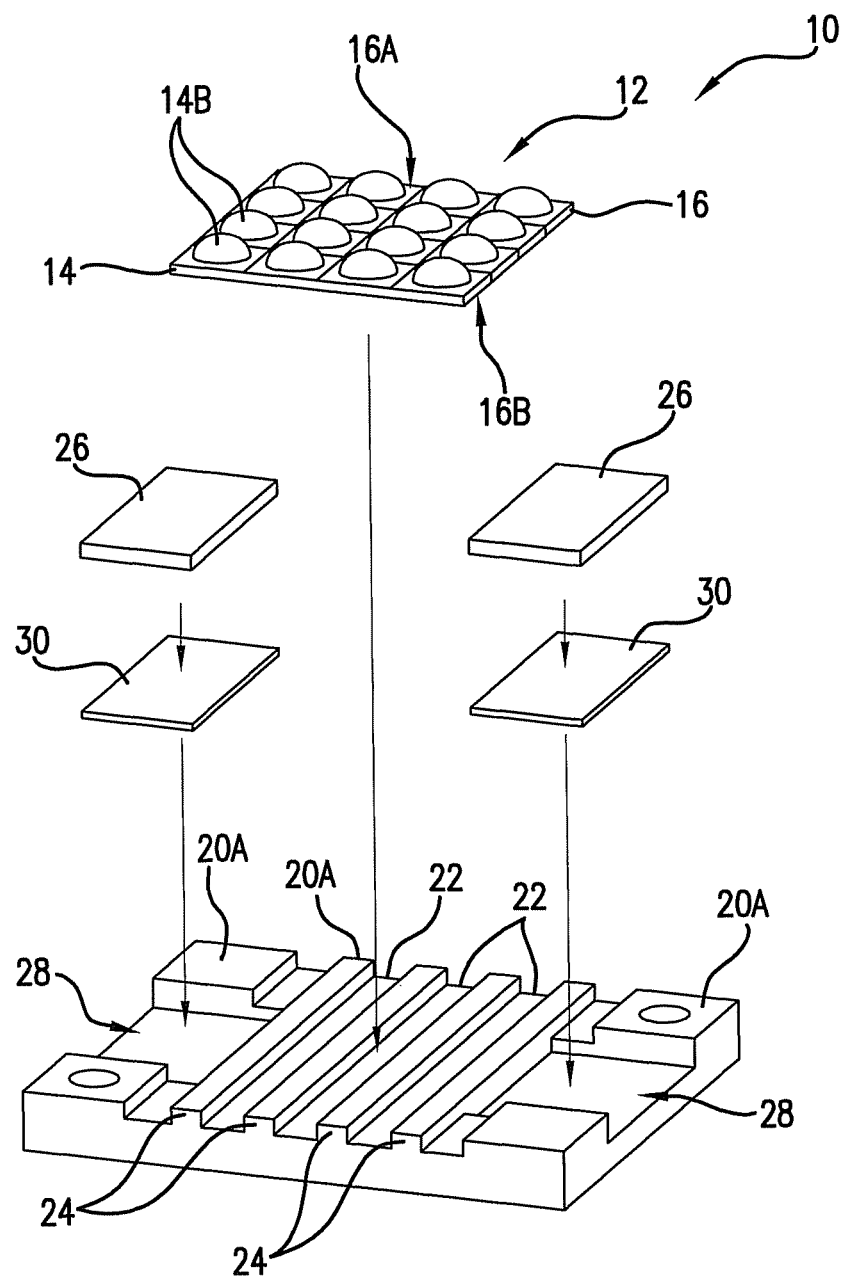
FIG. 3 is an exploded view of the embodiment of the LED array assembly according to FIG. 1.

Referring for example to FIGS. 1-3, a high-powered LED array assembly generally designated 10 is provided. LED array assembly 10 can comprise a high-powered LED array 12 that can comprise multiple LEDs 14 that can be formed on a single primary substrate 16. Each LED 14 can comprise an LED chip 14A (see FIG. 4A) and a lens 14B secured on an upper surface 16A of primary substrate 16. Primary substrate 16 can be mounted on a secondary substrate 20 that serves as a mounting apparatus. Secondary substrate 20 can include a top surface 20A that has grooves 22 therein. The portions of top surface 20A between grooves 22 can comprise raised contact portions 24 on which primary substrate 16 of LED array 12 can be attached.

As shown in FIGS. 1-3, LED array 12 can be connected, for example at opposing ends, to electrical contact element 26 that can be seated in secondary substrate 20 to provide power. For example, an electrical contact pad (described further below with reference to FIGS. 4B and 5B) on bottom surface 16B of primary substrate 16 of LED array 12 can be secured to electrical contact element 26 by solder 27 (shown in FIG. 2) or an electrically conductive adhesive or any other suitable technique. In some embodiments, electrical contact elements 26 can be considered a portion of secondary substrate 20. In some embodiments, electrical contact elements 26 can be insertable into and removable from secondary substrate 20. In some embodiments, electrical contact elements can be positioned on or outside of secondary substrate 20. For example, an electrical contact element can be part of a printed circuit board ("PCB") placed on secondary substrate 20.

Electrical contact elements 26 can be seated in recesses 28 at either end of secondary substrate 20. Recesses 28 can each extend through the outer positioned grooves 22 to the outer positioned raised contact portions 24. Electrical contact elements 26 can be positioned in recesses 28 such that a space can be provided between each outer positioned raised contact portion 24 and the electrical contact element 26 in the respective recess 28. Electrical contact elements 26 can be insulated from secondary substrate 20 by insulators 30, such as insulating material like an insulating tape. For example, insulators 30 can be double-stick KAPTON® tape to hold electrical contact elements 26 in recesses 28 and insulate electrical contact elements 26 from secondary substrate 20. The use of insulators 30 can allow the secondary substrate 20 material to potentially be both thermally and electrically conductive.

LED array 12 can be bonded to secondary substrate 20 at raised contact portions 24 in a manner that facilitates thermal transfer from LED array 12 and primary substrate 16 to raised contact portions 24 and secondary substrate 20. For example, thermal contact portions can be disposed between primary substrate 16 and secondary substrate 20 when primary substrate 16 is positioned on secondary substrate 20 with grooves 22 facing primary substrate 16. For instance, the thermal contact portions can be aligned with raised contact portions 24 between grooves 22 of secondary substrate 20. The thermal contact portions, as explained further below, can comprise thermal contact pads disposed on bottom surface 16B of primary substrate 16. The thermal contact pads can comprise a thermally conductive material such as metals like copper or aluminum. Alternatively, the thermal contact pads can comprise a non-metal material that is thermal conductive. The thermal contact pads on bottom surface 16B of primary substrate 16 of LED array 12 can be secured to raised contact portions 24 by solder 29 (shown in FIG. 2) or an electrically conductive adhesive. By having groves 22 between raised contact portions 24, open passageways P formed by primary substrate 16 and secondary substrate 20 can be created. These passageways P at grooves 22 can help to remove heat from LED array assembly 10. Further, these passageways P at grooves 22 can give electrical flux a pathway through which to travel and dissipate to reduce voids during soldering and other times.

Figure 4A:
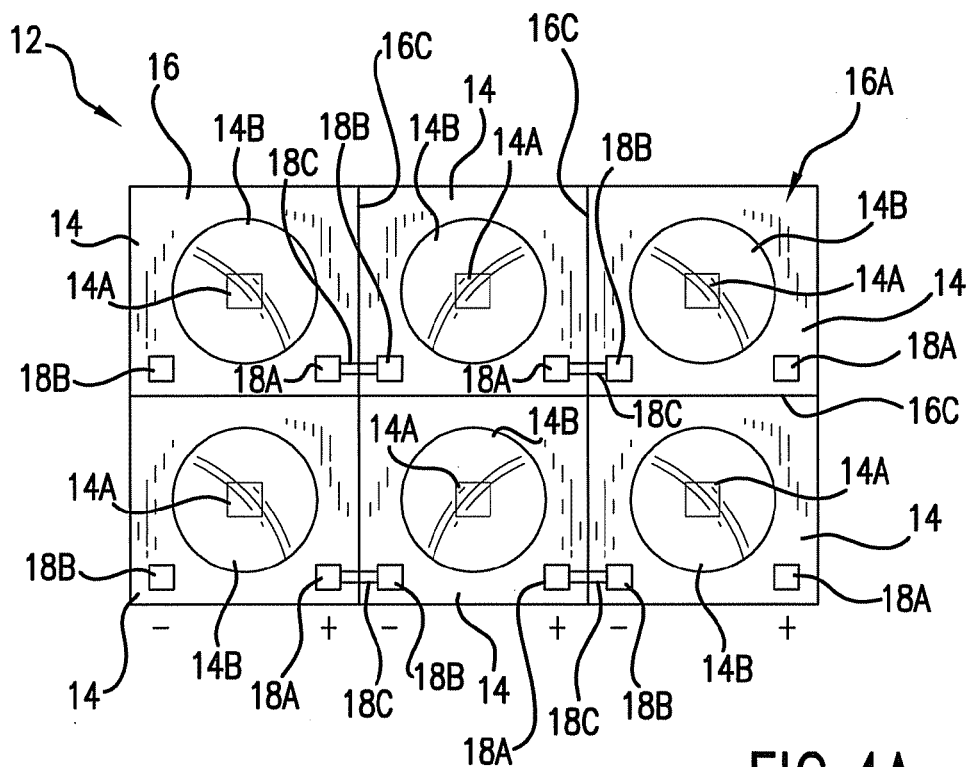
FIG. 4A is a top view of an embodiment of an LED array that can be used in an embodiment of the LED array assembly according to the subject matter disclosed herein.
Figure 4B:
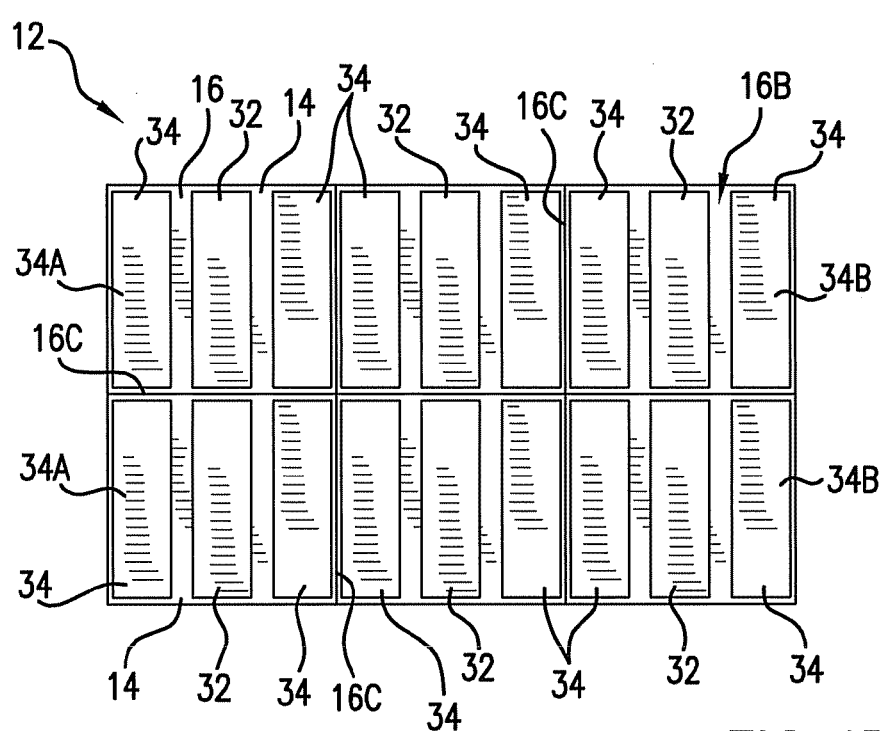
FIG. 4B is a bottom view of the embodiment of LED array according to FIG. 4A.
Figure 4C:
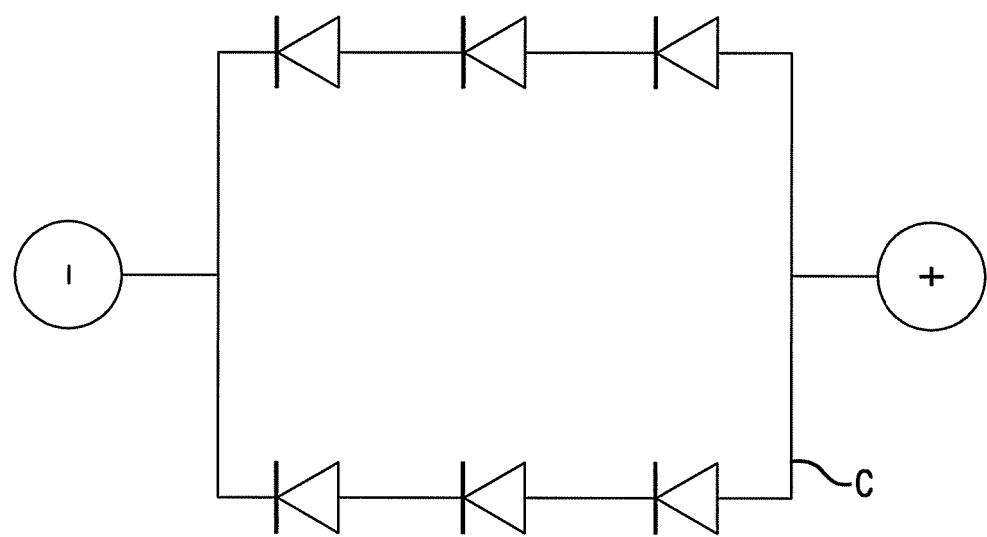
FIG. 4C is a schematic illustration of an embodiment of an electrical connection formed within the LED array according to FIG. 4A.

FIGS. 4A and 4B show an example embodiment of high-powered LED array 12, which can be considered a 2×3 array. Though a different embodiment of an LED array is shown in FIGS. 4A and 4B from the LED array shown FIGS. 1-3, the same reference characters are used to describe the common subject matter disclosed herein. High-powered LED array 12 can comprise single primary substrate 16 with multiple LEDs 14 thereon. Each LED 14 can comprise an LED chip 14A. Each LED 14 that is formed on primary substrate 16 can have an individual lens 14B formed over LED chip 14A on upper surface 16A. LEDs 14 with LED chips 14A and lens 14B can be formed in rows and columns on primary substrate 16. Each LED 14 within the LED array 12 can also comprise electrical connectors 18A and 18B to provide the ability to deliver power to each LED 14 in known manners. As shown in FIG. 4A, positive electrical connectors 18A for LEDs 14 can be aligned in primary substrate 16 with negative electrical connectors 18B in neighboring LEDs 14. In this manner, for example, LEDs 14 in LED array 12 can be easily electrically connected, for example, by electrical connectors 18C, such as short wirebonds, traces, leads, or the like, to form a circuit as depicted in circuit diagram C shown in FIG. 4C. Such an arrangement can be easy to manufacture and can be robust and durable. It should be understood that the electrical connectors can be positioned on LEDs 14 within primary substrate 16 in other locations and manners and can form different circuit configurations as would be understood by persons having ordinary skill in the art.

As stated above, LEDs 14 or LED chips 14A within LED array 12 on primary substrate 16 can be electrically connected. For example, LEDs 14 can be electrically connected in series as shown in the circuit diagram C in FIG. 4C with, for example with the shown embodiment, two rows of three LEDs 14 electrically connected in series as shown in FIG. 4A. In some embodiments, for example, each of the plurality of LEDs 14 can be connected to at least one other LED 14 by an electrical connector 18C, such as a shorting wirebond, trace or the like. Alternatively, masking used during creation of primary substrate 16 can permit the electrical connection to be formed between LEDs 14. As stated above, LED array 12 can be connected at either end to electrical contact element 26 (see FIG. 2) to provide power. Electrical contact elements 26 can be insulated from secondary substrate 20 by insulators 30, such as an insulating tape. As stated above, other power providing connectors can be used to deliver power to LED array 12.

Primary substrate 16 can have breaking lines 16C formed therein to allow individual packages of LEDs 14 or different sized LED arrays 12 to be separated from a larger body, if needed. For example, if failure occurs in one or more LEDs 14, then LED array 12 can be broken into individualized LEDs 14 or smaller arrays 12 along breaking lines 16C in primary substrate 16 for use in other products. In some embodiments, such lines 16C may not be formed in primary substrate 16.

As shown in FIG. 4B, primary substrate 16 can have one or more centered thermally conductive strips that can form thermal contact pads 32 that can be aligned with one or more contact portions 24 of secondary substrate 20 (see FIGS. 1-3). For example, the primary substrate 16 can have a thermal contact pad 32 for each LED 14 on primary substrate 16. As stated above, LEDs 14 with LED chips 14A and lens 14B can be aligned in rows and columns. In the embodiments shown, thermal pads 32 can extend longitudinally in a central location on each LED 14 on bottom surface 16B of primary substrate 16 under each LED chip 14A so that thermal contact pads 32 on LEDs 14 in each row generally extend in a line and are alignable with raised contact portions 24 on secondary substrate 20. Thus, referring to FIGS. 1-3, when primary substrate 16 is aligned and placed on secondary substrate 20, a row of thermal contact pads 30 for aligned LEDs 14 in the row can be secured to raised contact portions 24 extending above grooves 22 that can be aligned along each row. When primary substrate 16 is attached to secondary substrate 20 in this manner, LED chips 14A can be aligned with thermal contact pads 32, which are in turn aligned with raised contact portions 24 of secondary substrate 20 to facilitate faster heat dissipation away from the LEDs 14.

Alternatively, in some embodiments, instead of having thermal contact pads 32 integral to LEDS 14 and primary substrate 16, a row of thermal contact pads 30 can be secured to each raised contact portion 24 in secondary substrate 20 for attachment to primary substrate 16 below where LED chips 14 of LEDs 14 reside. In some embodiments, each raised contact portion 24 in secondary substrate 20 can be attached to primary substrate 16 below where LED chips 14 of LEDs 14 reside without any thermal contact pad therebetween.

As shown in FIG. 4B, each LED 14 within LED array 12 can have electrical contact pads 34 that can be connectable to an electrical contact element. Electrical contact pads 34 on bottom surface 16B of primary substrate 16 can be electrically connected to connectors 18A and 18B, respectively. For example, contact pads 34 can be connected to a respective connector 18A, 18B through vias as explained below. Within the LED array 12, outer contact pads 34A and 34B can be electrically connected to electrical contact elements 26 (examples shown in FIGS. 1-3) on a properly designed and proportioned secondary substrate to provide power to the LED array 12. Further, in some embodiments, electrical contact pads 34 might not be provided on bottom surface 16B of primary substrate 16. Instead, electrical connections may be made on just upper surface 16A of primary substrate 16 and/or within the body of primary substrate 16.

Contact portions (or islands) 24 between grooves 22 can provide an extremely efficient thermal path. For example, the thermal path can be from the LED chip to a layer of AuSn DA to a metal bond pad to an AlN or Al$_2$O$_3$ substrate to another metal bond pad (thermal contact pad) of primary substrate 16 to the solder holding primary substrate 16 to secondary substrate 20 to secondary substrate 20. Secondary substrate 20 can comprise metal such as copper or aluminum. Alternatively, secondary substrate 20 can comprise molded or extruded material such as thermally conductive plastics and/or polymers, FR4, or other material. Thus, secondary substrate 20 can comprise a heat sink or other heat dissipative object. Grooves 22 between contact portions 24 of secondary substrate 20 can help form or be attached to heat pipes to further aid in dissipating heat from LED array 12. For example, passageway P formed between primary substrate 16 and secondary substrate 20 at grooves 22 can form and serve as a heat pipe that can be attached to an external heat pipe (not shown) to increase dissipation of heat.

Figure 5A:
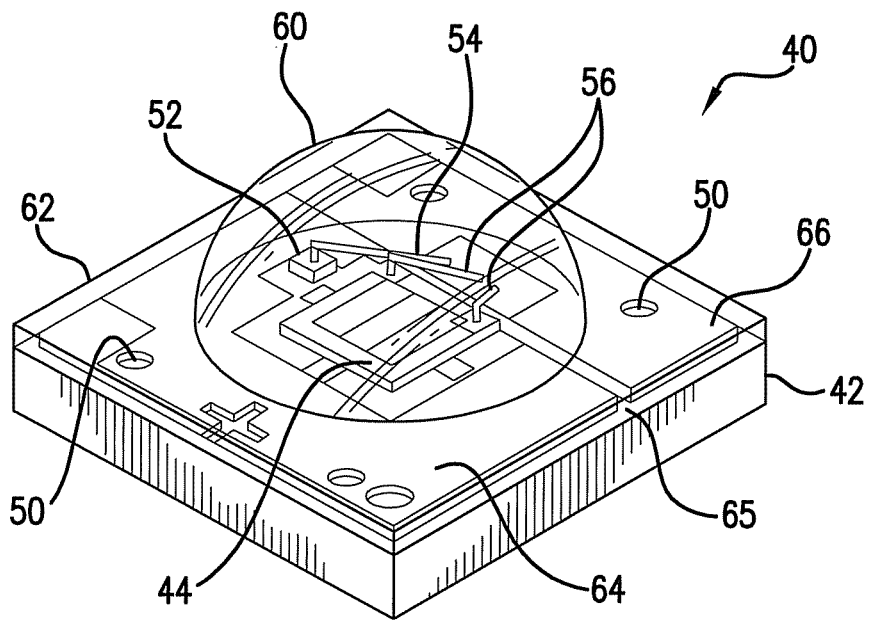
FIG. 5A is an upper perspective view of an embodiment of an individualized LED package that can form a portion of an LED array that can be used an embodiment of an LED array assembly according to the subject matter disclosed herein.
Figure 5B:
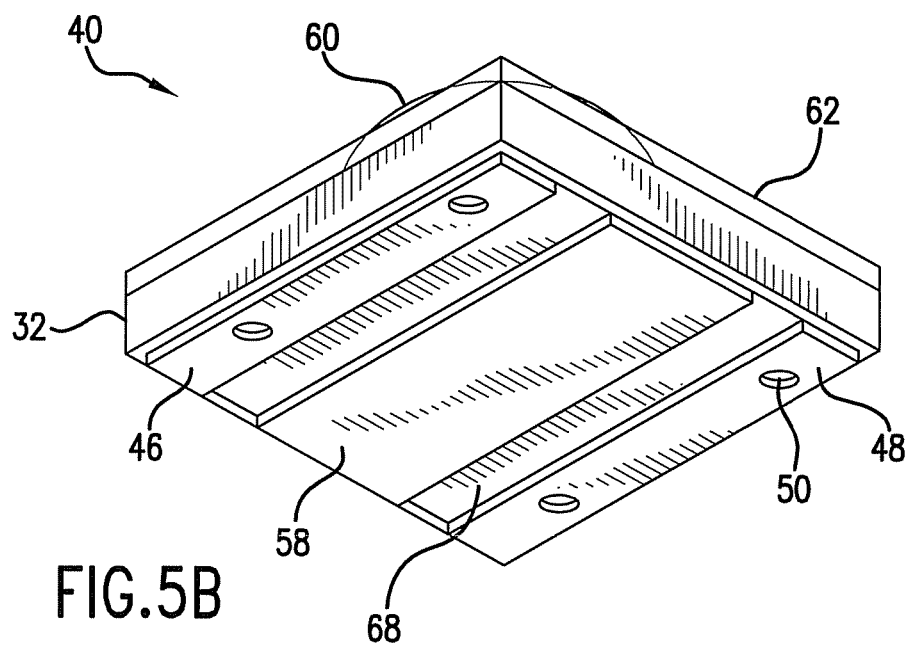
FIG. 5B is a bottom perspective view of the LED package according to FIG. 5A.

FIGS. 5A and 5B show an example embodiment of an individualized LED package 40 that can be formed from LEDs 14 in LED array 12 if broken away from LED array 12. It is understood that, in LED array 12, the LED packages are still connected through primary substrate 16. The description of individual LED package 40 is provided to illustrate an example embodiment of a possible configuration of LEDs 14 within a single solitary primary substrate 16 and is not meant as a limitation to possible configurations. While LEDs 14 can be integrally provided on primary substrate 16, primary substrate 16 can, for example as shown in FIGS. 4A and 4B, have breaking lines 16C formed therein on one or both surfaces 16A, 16B. As stated above, if failure occurs in one or more LEDs 14, then LEDs 14 in LED array 12 can be broken into individualized LED packages or smaller LED arrays along breaking lines 16A in primary substrate 16 for use in other products.

LED package 40 can generally comprise a submount 42, LED chip 44, first and second electrical contact pads 46, 48, vias 50, ESD diode 52, wire bonds 54, 56, metalized area 58, lens 60 and protective layer 62. Submount 42 can comprise a primary substrate that has been broken to leave the remaining individual submount 42. In LED package 40, a mounting pad area can comprise a rectangular shaped first conductive layer that forms positive electrical connector 64 on and covering, for example, at least the majority of submount 42. Vias 50 can run or extend between first electrical connector 64 and first contact pad 46 on one side of first electrical connector 64, with LED chip 44 and ESD diode 52 mounted to the mounting pad area on the opposing side.

A second conductive layer that forms negative electrical connector 66 can cover most of the remainder of the submount's top surface, with a gap 65 between first and second connectors 64, 66. Vias 50 can run or extend between second connector 66 and second contact pad 48, with wire bonds 54, 56 running and disposed between second connector 66 and LED chip 44 and ESD diode 52. Thus, an electrical signal applied to first and second contact pads 46, 48 can be conducted to LED chip 44, causing it to emit light.

In this embodiment, first and second connectors 64, 66 can cover substantially all of the submount's top surface, providing the capability for broad lateral heat spreading from LED chip 44.

LED package 40 can further comprise a metalized area that can form a thermal contact pad 58 on back surface 68 of submount 42, between first and second electrical contact pads 46, 48. Thermal contact pad 58 can be made of a heat conductive material and can be in at least partial vertical alignment with LED chip 44. In the embodiments shown, thermal contact pad 58 is not in electrical contact with the elements on top surface of submount 42 or first and second electrical contact pads 46, 48 on back surface 68 of submount 42. Although heat from LED chip 44 is laterally spread over the top surface of submount 42 by the mounting pad area formed by connector 64 in such an embodiment, more heat will pass into submount 42 directly below and around LED chip 44. Thermal contact pad 58 can assist with this dissipation by allowing this heat to spread into an area where it can dissipate more readily. It is also noted that the heat can conduct from the top surface of submount 42, through vias 50, where the heat can spread into the first and second contact pads 46, 48 where it can also dissipate. The thickness of thermal contact pad 58 and first and second electrical contact pads 46, 48 can be approximately the same such that all three make contact to a level surface in case LED package 40 ends up being used in a surface mounting application.

Figure 6A:
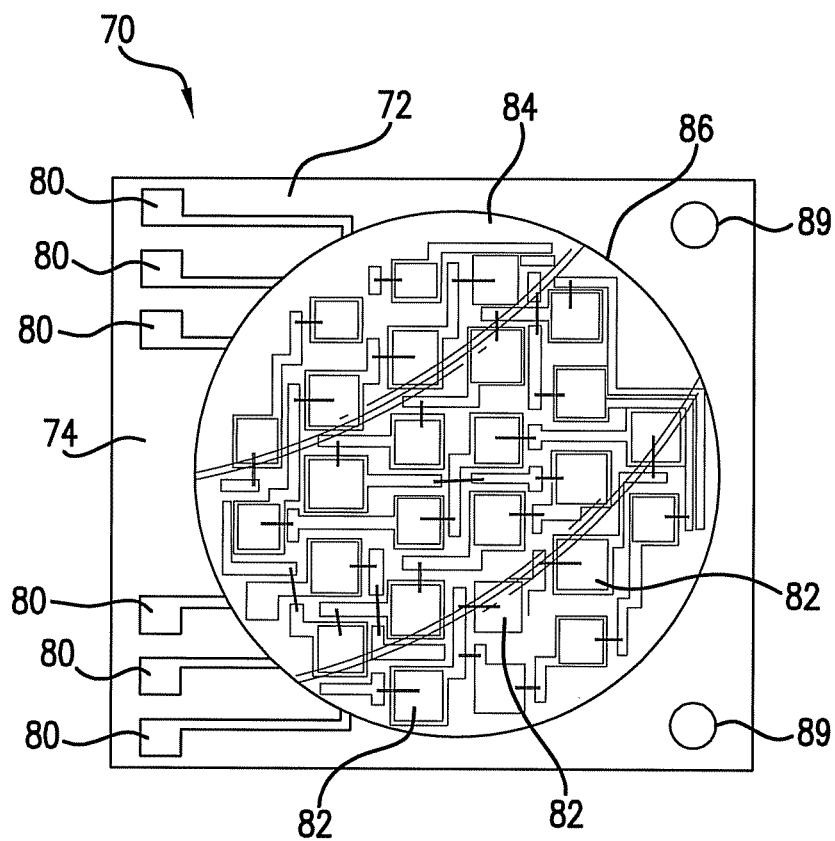
FIG. 6A is a top view of another embodiment of an individualized LED package that can form a portion of an LED array that can be used in an embodiment of an LED array assembly according to the subject matter disclosed herein.
Figure 6B:
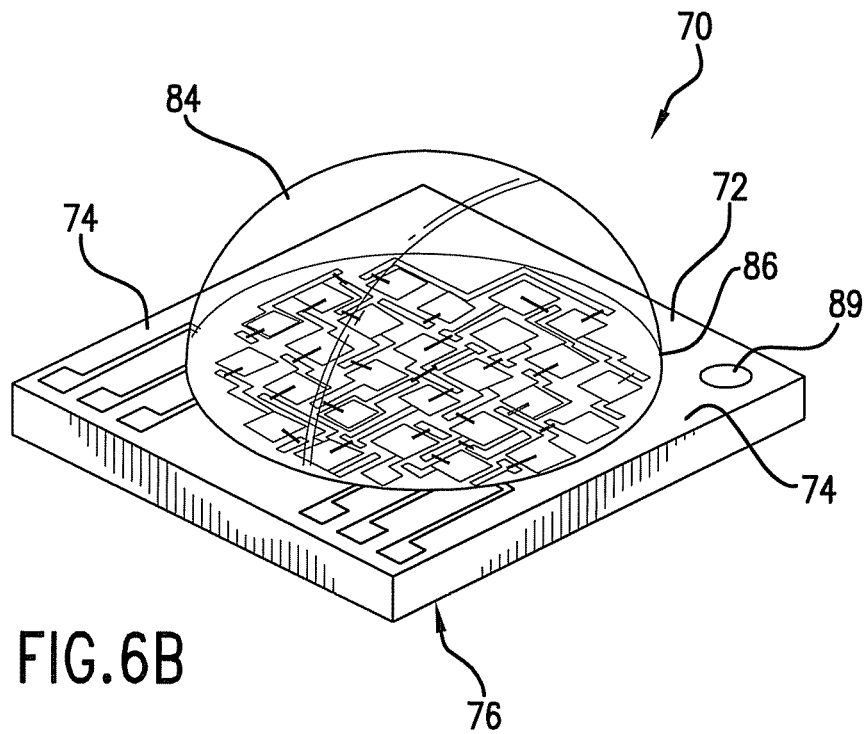
FIG. 6B is an upper perspective view of the embodiment of the LED package shown in FIG. 6A.

FIGS. 6A and 6B illustrate another example embodiment of an individualized device package that can be formed from LEDs 14 in LED array 12 if broken away from LED array 12 as disclosed herein. It is understood that, in LED array 12, the LED packages are still connected through primary substrate 16. The description of individual LED package 70 is provided to illustrate an example embodiment of a possible configuration of LEDs 14 within a single solitary primary substrate 16 and is not meant as a limitation to possible configurations. As stated above, if failure occurs in one or more LEDs 14, then LED array 12 can be broken into individualized LEDs 14 along breaking lines 16A in primary substrate 16 for use in other products.

LED package 70 can comprise a substrate 72 having a top surface 74 and bottom surface 76. Substrate 72 can be comprised of a primary substrate that has been broken into the individual substrate 72. Substrate 72 can be a material such as, for example, silicon, copper, silver, FR4, aluminum, thermally conductive polycarbonate, or other suitable material. Substrate 72 may be formed of many different materials, including electrically insulating materials. Suitable substrate materials also can comprise, but are not limited to, ceramic materials such as aluminum nitride (AlN) and alumina ($Al_2O_3$). Dimensions of substrate 72 can vary widely depending on the applications and processes used to manufacture LED package 70 and possibly the LED arrays and array assemblies in which it can be used.

LED package 70 can comprise electrical contacts 80. In some embodiments, electrical contacts 80 can be disposed only on the top surface 74 of the substrate 72. For example, electrical contacts 80 can be electrically connected to one or more LED chips 82 (see FIG. 6A) in a known manner as understood by one of ordinary skill in the art. In the embodiment shown in FIGS. 1A and 1B, six electrical contacts 80 are shown. The number of electrical contacts 80 can vary and can be dependent upon the number of LED chips 82 used in LED package 70. The number of LED chips 82 can, for example, vary between about 1 to about 25 or more for a given package size. More LED chips such as chips 82 can be included in larger package sizes. LED chips 82 can be connected in series. For example, alternating lines of red light producing LED chips 82 and white light producing LED chips 82 can be used in LED package 70. Thus, the manner in which LED chips 82 are connected can also affect the number of electrical contacts 80 in LED package 70. Power can be provided by PCBs or flex PCBs that can connect to electrical contacts 80 can provide leads to connection to a power source.

By having the electrical contacts 80 only on top surface 74 of substrate 72 as shown in one aspect, LED package 70 can be formed on a larger primary substrates. While substrate 72 is shown to have a rectangular plan view shape, the substrate can vary in size and shape. Thus, breaking lines 16A (see FIGS. 4A and 4B) on primary substrate 16 can be configured differently on different embodiments of primary substrates 16 and LED arrays 12. Top surface 74 can also comprise markers 89 that can aid a user in determining the orientation of the LED package 70 or LED array in which it is used when being installed.

LED chips 82 can be covered by a lens 84 that can be formed of different material. For example, encapsulation material can be used to encapsulate LED chips 82 and their associated bonding wires and mounting pads in a compression mounting process to form lens 84. Other lens material can be used. In the embodiment shown, lens 84 is formed into a domed shape. The dome shape of lens 84 can be generally a hemispherical shape with base 86 of lens 84 having the greatest diameter. Other lens shapes can be used.

Thermal contact pads can reside on a bottom surface of substrate 72 in a manner similar to the embodiments shown and described in FIGS. 4A-5B. Alternatively, no thermal contact pad resides on the bottom surface of substrate 72, so that the bottom surface of substrate 72 contacts a thermal contact portion between the bottom surface of substrate 72 and raised contact portions 24 of secondary substrate 20. In such embodiments, thermal contact pads can be disposed on raised contact portions 24 of secondary substrate 20. In other embodiments of LED package 70, the electrical contact pad can be configured to be located on the bottom surface of substrate 72 through vias as described above, or by other means known to a person of ordinary skill in the art.

Referring back to FIGS. 1-3, since LED array 12 can be large, coefficient of thermal expansions (CTE) mismatch would normally be a problem for attaching to a flat surfaced substrate, but grooves 22 in secondary substrate 20 can provide stress relief by limiting the amount of contact between secondary substrate 20 and LED array 12 and providing space for expansion. This can be accomplished by contact portions 24 and grooves 22. Raised contact portions 24 can provide contact as well as stress relief between secondary substrate 20 and primary substrate 16 as shown in FIGS. 1 and 2. In some embodiments, the thermal contact portion areas between primary substrate 16 and secondary substrate 20 can be floating, in that the primary substrate can freely move during thermal expansion while physical contact to help dissipate heat can still be maintained between primary substrate 16 and secondary substrate 20.

Secondary substrate 20 that forms the mounting apparatus can provide many benefits, structural and otherwise. Grooves 22 can avoid electrical contact to individual LEDs 14 within the array allowing them to be connected electrically in strings. Most of the mechanical aspects of secondary substrate 20 can be manufactured by extrusion, making it easier to manufacture and possibly increase reliability. The electrical contact element 26 can be made from a white flex printed circuit board (PCB) with a tape-like adhesive, such as KAPTON® tape.

As shown in FIG. 3, one or more grooves 22 of secondary substrate 20 can extend at least substantially across an upper surface 20A of secondary substrate 20 in at least one direction. Thermal contact portions 38 can be disposed between primary substrate 16 and secondary substrate 20. Thermal contact portions 38 can be attached to a bottom 16B of primary substrate 16. Thermal contact pads 30 can extend from bottom surface 16B of primary substrate 16 and contact, such as for example through solder contact, raised contact portions 24 of secondary substrate 20.

The LED array constructions can provide other advantages also. LED array 12 comprising one or more primary substrates 16 can be solder-bonded to the secondary substrate 20 and an electrical contact element 26 at once and does not have to be done individually. As stated above, if LED array 12 yields are not 100%, the panel of LEDs 14 that forms LED array 12 can be pre-tested and mapped to allow dicing for maximum yield. For example, LED array 12 sizes and positions can be determined after testing, but before dicing.

As shown in FIGS. 7A-8D, the LED arrays and secondary substrate can come in many different sizes. FIGS. 7A-7F provide six illustrative embodiments as examples of many possible embodiments of the LED arrays. FIGS. 8A-8D provide four illustrative embodiments as examples of many possible embodiments of the secondary substrates. The embodiments provided are meant to be examples and are not meant as limitations to the number of possible embodiments for both the LED arrays and the secondary substrate, respectively. Dimensions of both the LED arrays and the secondary substrate can vary widely depending on the processes used to manufacture the LED arrays and the secondary substrate and the applications of the LED arrays, secondary substrates and array assemblies in which it can be used. The width, depth and length of the grooves in the secondary substrates can depend on the size, shape and configuration of the LEDS in the LED array, the design and configuration of the alignment of the grooves and contact portions of the secondary substrate with the LEDs in the LED array, and the design and configuration of the LED array. Thus, the size, shape and configurations of both the LED arrays and the secondary substrate can vary.

Figure 8A:
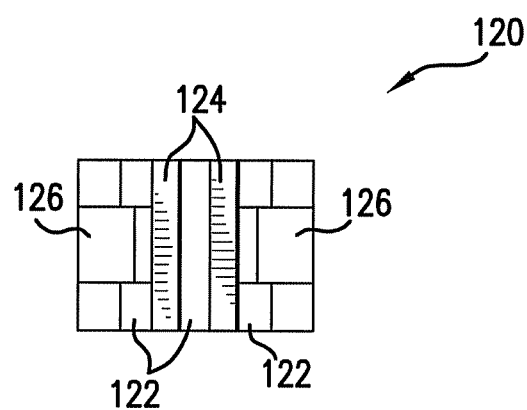
FIGS. 8A-8D are schematic top views of example embodiments of secondary substrates that can be used in different embodiments of an LED array assembly according to the subject matter disclosed herein.

As shown in FIG. 7A, the LED array can comprise a 2×2 LED array generally designated 112 with four LEDs 114 formed with four LED chips (not shown) on a primary substrate 116 and each covered by a lens 114B. Such an LED array 112 can be attached to a secondary substrate generally designated 120 that is shown in FIG. 8A. Secondary substrate 120 can comprise two raised contact portions 124 between grooves 122. Secondary substrate 120 can also have electric contact elements 126 at either end of secondary substrate 120 that can be positioned at least about parallel to raised contact portions 124 for providing power to LED array 112 when secured to secondary substrate 120 as described above with reference to LED array 12 and secondary substrate 20 in FIGS. 1-3. As with the other embodiments shown in FIGS. 7A-7F, electrical contact elements 126 can be seated in recesses at either end of secondary substrate 120. The recesses can each extend through the outer positioned grooves 122 to the outer positioned raised contact portions 124. Electrical contact elements 126 can be positioned in the recesses such that a space can be provided between each outer positioned raised contact portion 124 and the electrical contact element 126 in the respective recess. Electrical contact element 126 can be insulated from secondary substrate 120.

Figure 8B:
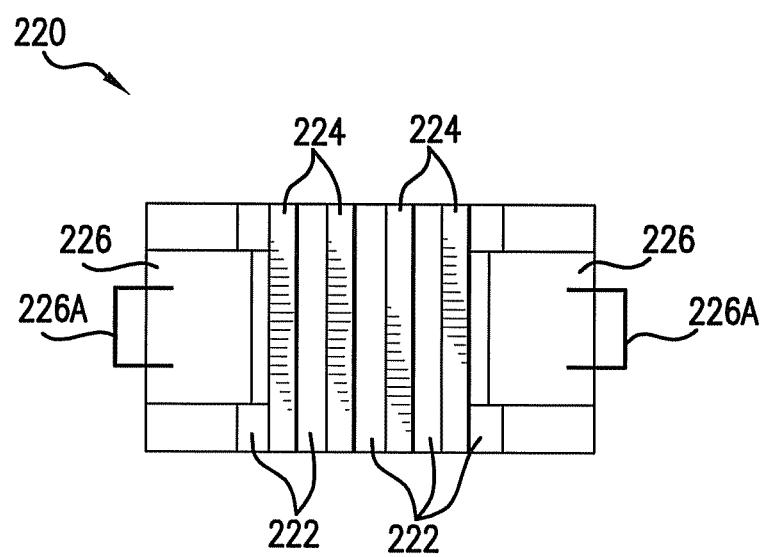

As shown in FIG. 7B, the LED array can comprise a 4×4 LED array generally designated 212 with 16 LEDs 214 formed with 16 LED chips (not shown) on a primary substrate 216 and each covered by a lens 214B. Such an LED array 212 can be attached to a secondary substrate generally designated 220 that is shown in FIG. 8B. Secondary substrate 120 can comprise four raised contact portions 224 between grooves 222 on which primary substrate 216 can reside above grooves 222. Secondary substrate 220 can also have electric contact elements 226 at either end of secondary substrate 220 for providing power to LED array 212 when secured to secondary substrate 220 in a manner as described above. An electrical lead 226A can be attached to electrical contact element 226 to facilitate attachment to a power source.

Figure 8C:
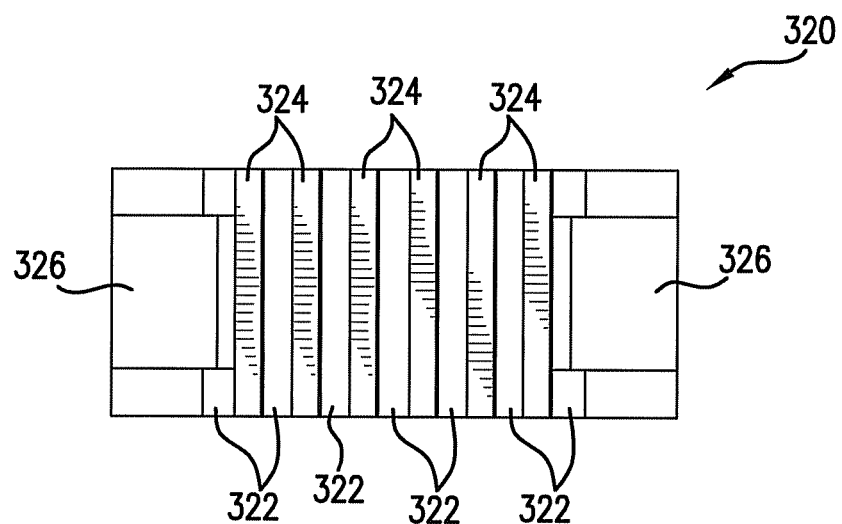

As shown in FIG. 7C, the LED array can comprise a 4×6 LED array generally designated 312 with 24 LEDs 314 formed with 24 LED chips (not shown) on a primary substrate 316 and each covered by a lens 314B. Similarly, the LED array can comprise a 6×6 LED array generally designated 412 with 36 LEDs 414 formed with 36 LED chips (not shown) on a primary substrate 416 and each covered by a lens 414B shown in FIG. 7D. Such LED arrays 312, 412 can be attached to a secondary substrate generally designated 320 that is shown in FIG. 8C. Secondary substrate 320 can comprise six raised contact portions 324 between grooves 322. Secondary substrate 220 can also have electric contact elements 326 on secondary substrate 320 for providing power to LED array 312 when secured to secondary substrate 320 in a manner as described above. Depending on the configuration of LED array 312 and its primary substrate 316 shown in FIG. 7C, LED array 312 could alternatively be attached to a secondary substrate similar to that of secondary substrate 220 as shown in FIG. 8B.

The width of LED array 412 can be larger than the width of secondary substrate 320 so that primary substrate 416 can overhang secondary substrate 320. LED array 412 can comprise one or more electrical leads instead of substrate 320 having electrical contact elements 326 so that power can be supplied directly to LED array 412.

Figure 8D:
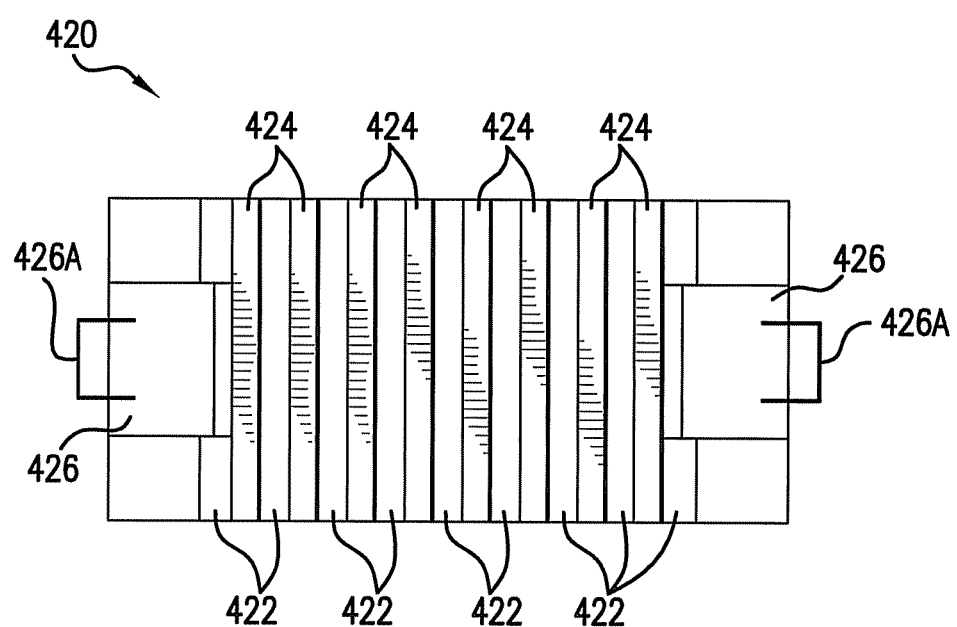

As shown in FIG. 7E, the LED array can comprise a 6×8 LED array generally designated 512 with 48 LEDs 514 formed with 48 LED chips (not shown) on a primary substrate 516 and each covered by a lens 514B. Similarly, the LED array can comprise an 8×8 LED array generally designated 612 with 64 LEDs 614 formed with 64 LED chips (not shown) on a primary substrate 616 and each covered by a lens 614B shown in FIG. 7F. Such LED arrays 412, 612 can be attached to a secondary substrate generally designated 420 that is shown in FIG. 8D. Secondary substrate 420 can comprise eight raised contact portions 424 between grooves 422. Secondary substrate 420 can also have electric contact elements 426 on secondary substrate 420 for providing power to LED array 512, 612 when secured to secondary substrate 420 in a manner as described above. Electrical contact element 426 can have an electrical lead 426A attached thereto to facilitate attachment to a power source. Depending on the configuration of LED array 512 and its primary substrate 516 shown in FIG. 7E, LED array 512 could alternatively be attached to a secondary substrate similar to that of secondary substrate 320 as shown in FIG. 8C.

The width of LED array 612 can be larger than the width of secondary substrate 420 so that primary substrate 616 can overhang secondary substrate 420. As described in relation to LED array 412, LED array 612 can comprise one or more electrical leads instead of substrate 420 having electrical contact elements 426 and lead 426A so that power can be supplied directly to LED array 612.

In each of the embodiments of the LED arrays and secondary substrates respectively illustrated in FIGS. 7A-8D, the primary substrate can overhang the secondary substrate and can provide one or more electrical leads. Additionally, at least one or more external heat pipes (not shown) can be disposed in the grooves of the secondary substrates illustrated in FIGS. 8A-8D when secured to the primary substrates of the LED arrays illustrated in FIGS. 7A-7F, for example, for further dissipating heat. Further, each of the light emitting devices can comprise a separate lens as shown in the embodiments illustrated in FIGS. 7A-7F, or the array of light emitting devices can be covered by a common lens.

Figure 9:
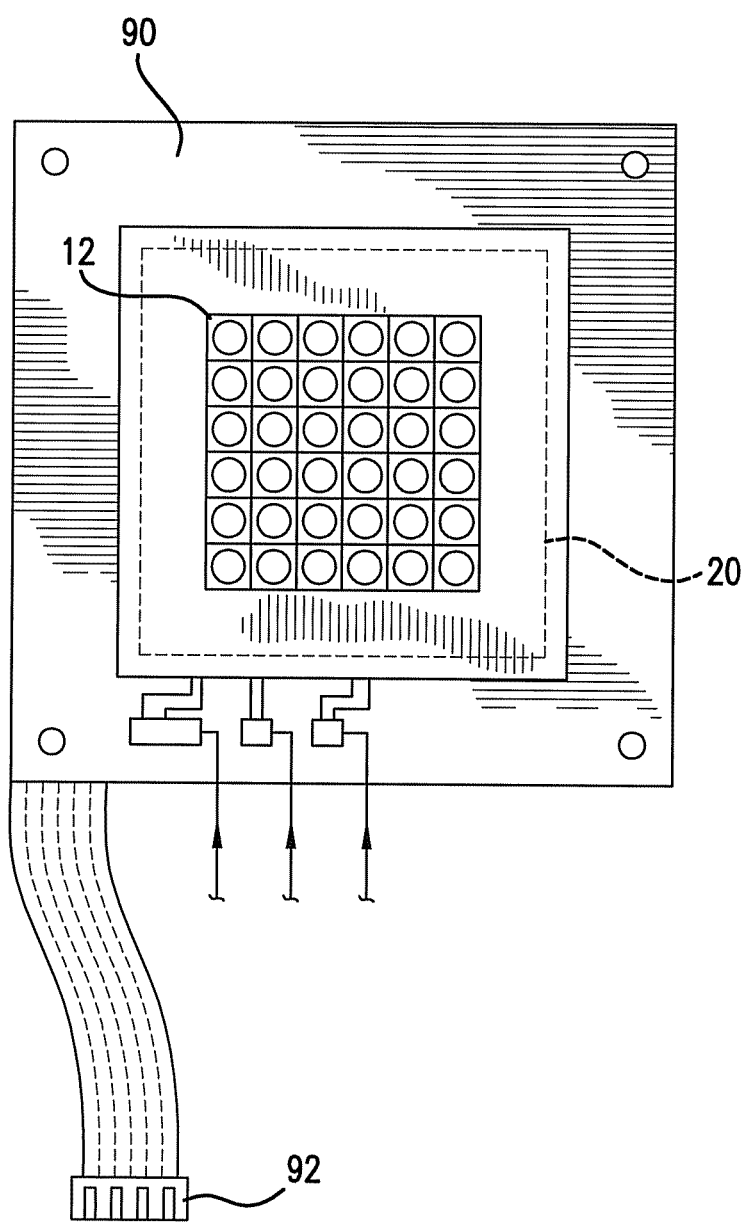
FIG. 9 is a top view of an embodiment of an LED array assembly with an embodiment of a printed circuit board (PCB) attached to the LED array assembly according to the subject matter disclosed herein.

As shown in FIG. 9, a PCB 90 can be secured within and to secondary substrate 20 so that it surrounds LED array 12.

PCB 90 can be white. The whiteness of PCB 90 can act as a diffuse reflector surrounding LED array 12. Also, PCB 90 can overhang, providing leads 92 that can be plugged into a socket or soldered to the system. A flex printed circuit board can be used in LED array 12. The flex printed circuit board can provide an electrical contact with at least a portion of primary substrate 16. It can also provide an electrical contact for connecting to a lamp or luminaire that extends from LED array 12.

Embodiments of the present disclosure shown in the drawings and described above are examples of numerous embodiments that can be made within the scope of the appended claims. It is contemplated that the configurations of LED array assemblies and methods of making the same can comprise numerous configurations other than those specifically disclosed.

What is claimed is:

1. A light emitting device array assembly comprising:
    a single primary substrate;
    a plurality of light emitting diode (LED) chips disposed on the primary substrate; and
    a secondary substrate comprising at least one or more grooves provided between at least two or more raised contact portions;
    wherein the primary substrate is positionable on the secondary substrate such that portions of the primary substrate physically contact the two or more raised contact portions, and wherein the LED chips are aligned with at least one of the raised contact portions of the secondary substrate.

2. The light emitting device array assembly according to claim 1, further comprising thermal contact portions disposed between the primary substrate and the secondary substrate when the primary substrate is positioned on the secondary substrate with the grooves facing the primary substrate.

3. The light emitting device array assembly according to claim 2, wherein the thermal contact portions are aligned with the raised contact portions between the grooves of the secondary substrate.

4. The light emitting device array assembly according to claim 3, wherein the thermal contact portions comprise thermal contact pads disposed on a bottom surface of the primary substrate.

5. The light emitting device array assembly according to claim 1, wherein the secondary substrate comprises a plurality of parallel grooves.

6. The light emitting device array assembly according to claim 1, wherein the raised contact portions provide thermal contact as well as stress relief between the secondary substrate and the primary substrate.

7. The light emitting device array assembly according to claim 1, wherein the secondary substrate comprises a heat sink.

8. The light emitting device array assembly according to claim 1, wherein the plurality of light emitting devices is electrically connected.

9. The light emitting device array assembly according to claim 1, wherein each of the plurality of light emitting devices is connected to at least one other light emitting device.

10. The light emitting device array assembly according to claim 1, wherein the primary substrate is soldered to the secondary substrate.

11. The light emitting device array assembly according to claim 1, wherein the secondary substrate is metallic.

12. The light emitting device array assembly according to claim 1, wherein the one or more grooves of the secondary substrate extend at least substantially across an upper surface of the secondary substrate in at least one direction.

13. The light emitting device array assembly according to claim 1, further comprising thermal contact portions disposed between the primary and secondary substrates.

14. The light emitting device array assembly according to claim 13, wherein the thermal contact portions are attached to a bottom surface of the primary substrate.

15. The light emitting device array assembly according to claim 14, wherein the thermal contact portions extend from the bottom surface of the primary substrate and physically contact the raised contact portions of the secondary substrate.

16. The light emitting device array assembly according to claim 1, further comprising a printed circuit board.

17. The light emitting device array assembly according to claim 16, wherein the printed circuit board comprises a flex printed circuit board.

18. The light emitting device array assembly according to claim 17, wherein the flex printed circuit board provides an electrical contact with at least a portion of the primary substrate and can comprise a white reflective surface.

19. The light emitting device array assembly according to claim 16, wherein the printed circuit board overhangs the secondary substrate and provides one or more electrical leads.

20. The light emitting device array assembly according to claim 1, wherein the primary substrate overhangs the secondary substrate and provides one or more electrical leads.

21. The light emitting device array assembly according to claim 1, wherein the light emitting device array comprises a 4×4 light emitting device array, a 4×6 light emitting device array, a 6×6 array of light emitting device array, a 6×8 light emitting device array, or an 8×8 light emitting device array.

22. The light emitting device array assembly according to claim 1, wherein each of the light emitting devices comprises a separate lens.

23. A light emitting diode (LED) array assembly comprising:
    a single primary substrate;
    a secondary substrate comprising an anode and a cathode; and
    an array of LED chips provided over the primary substrate and electrically connected between the anode and the cathode of the secondary substrate;
    wherein the array of LED chips comprises at least one column and at least one row of LED chips, and wherein the primary substrate is positionable over the secondary substrate between portions of the anode and the cathode.

24. The LED array assembly according to claim 23, wherein at least some chips in the array of LED chips are configured to emit light that is a different color than at least some other chips in the array of LED chips.

25. The LED array assembly according to claim 23, wherein a lens is provided over each LED chip.

26. The LED array assembly according to claim 23, wherein the secondary substrate comprises one or more raised thermal contact portions provided between the anode and the cathode.

27. The LED array assembly according to claim 23, wherein one or more gaps are provided between the primary substrate and the secondary substrate.

28. The LED array assembly according to claim 23, wherein the secondary substrate is metallic.

29. The LED array assembly according to claim 23, wherein the primary substrate is physically, thermally, and electrically connected to the secondary substrate.

30. The LED array assembly according to claim 23, wherein the array of LED chips comprises a plurality of serially connected strings of LED chips, and wherein each string of LED chips is electrically connected in parallel between the anode and the cathode.

* * * * *